(12) United States Patent  
Kobayashi

(10) Patent No.: US 8,150,071 B2  
(45) Date of Patent: Apr. 3, 2012

(54) VOICE OUTPUT UNIT

(75) Inventor: Mitsuru Kobayashi, Tsu (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 12/376,602

(22) PCT Filed: Sep. 19, 2007

(86) PCT No.: PCT/JP2007/068125  
§ 371 (c)(1),  
(2), (4) Date: Feb. 6, 2009

(87) PCT Pub. No.: WO2008/041479  
PCT Pub. Date: Apr. 10, 2008

(65) Prior Publication Data  
US 2010/0183169 A1 Jul. 22, 2010

(30) Foreign Application Priority Data  
Sep. 29, 2006 (JP) ................................. 2006-269767

(51) Int. Cl.  
*H03G 3/00* (2006.01)

(52) U.S. Cl. ........................................................ 381/104

(58) Field of Classification Search .................. 381/104  
See application file for complete search history.

(56) References Cited

U.S. PATENT DOCUMENTS

| | | | |
|---|---|---|---|
| 5,494,781 A | 2/1996 | Ohtani et al. | |
| 6,324,291 B1 | 11/2001 | Weidner | |
| 6,456,720 B1 | 9/2002 | Brimhall et al. | |
| 2001/0040973 A1 * | 11/2001 | Fritz et al. | 381/322 |
| 2008/0025582 A1 | 1/2008 | Kobayashi | |
| 2008/0267436 A1 * | 10/2008 | Kerselaers et al. | 381/315 |

FOREIGN PATENT DOCUMENTS

| | | |
|---|---|---|
| CN | 2165579 | 5/1994 |
| CN | 2591913 | 12/2003 |
| CN | 1619610 | 5/2005 |
| GB | 357171 | 9/1931 |
| JP | 5-335995 A | 12/1993 |
| JP | 7-066533 A | 3/1995 |
| JP | 2001-068867 A | 3/2001 |
| JP | 2002-076649 A | 3/2002 |
| WO | 01/43497 | 6/2001 |

OTHER PUBLICATIONS

English language Abstract of JP 5-335995 A.  
English language Abstract of JP 2002-076649 A.  
English language Abstract of JP 2001-068867 A.  
English language Abstract of JP 7-066533 A.  
Korean Office Action on Jun. 30, 2011.

* cited by examiner

*Primary Examiner* — Kiesha Bryant  
*Assistant Examiner* — Marvin Payen  
(74) *Attorney, Agent, or Firm* — Greenblum & Bernstein, P.L.C.

(57) ABSTRACT

An appliance is provided which can be easily assembled, assures quality and reliability, and can be downsized. A voice output unit includes: a power source supplying power; a signal processing module which processes voice signals received from an external source, and amplifies the processed voice signals processed; a speaker module transmitting the amplified voice signals as voice signals; and a stereoscopic circuit board on which the power source, signal processing module, and speaker module are assembled, and includes electrodes which are in electric contact with electrodes of the foregoing components.

4 Claims, 4 Drawing Sheets

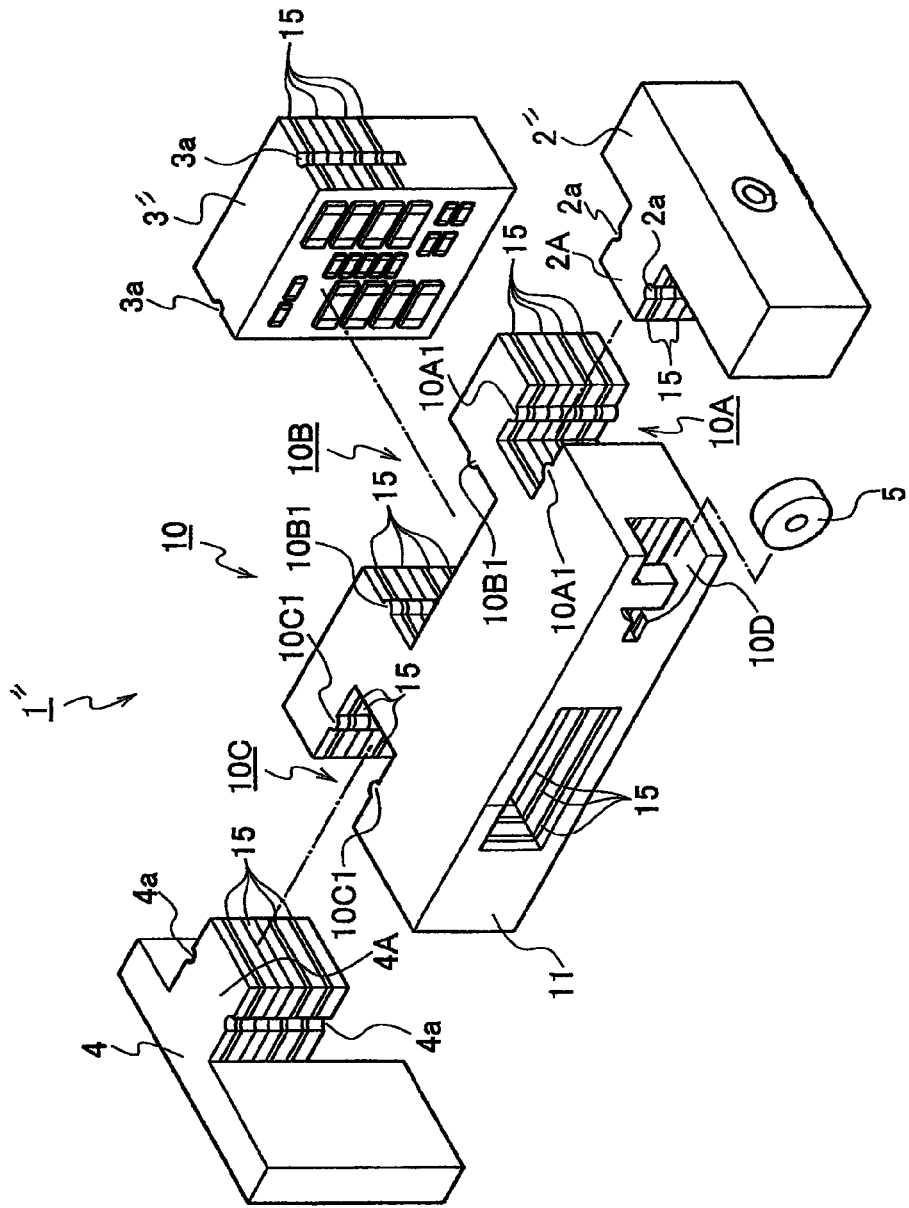

VOICE OUTPUT UNIT

TECHNICAL FIELD

This invention relates to a voice output unit which amplifies voice signals and outputs voice sounds outside.

BACKGROUND ART

As electronics devices are being extensively downsized, components constituting them are required to be assembled in a harmonized and packed manner and to save spaces. In order to meet such a requirement, more and more electronic devices become very difficult to be assembled on an existing flat printed circuit board like a glass epoxy printed circuit board. The Molded Interconnect Device (MID) technology has been proposed in order to overcome the foregoing problem. Specifically, the Microscopic Integrated Processing Technology (MITPTEC) has been proposed in order that micro fabricated electronic circuits can be three-dimensionally mounted on a molded circuit board. Refer to Japanese Patent Laid-open Publication Hei 7-66533, for instance.

The Microscopic Integrated Processing Technology is applicable to fabricating appliances in which electric circuits, electric mechanical functional components and so on are assembled on a molded circuit board. Specifically, microscopic three-dimensional circuits can be fabricated by using lasers. Further, circuit patterns on printed circuit boards can be freely modified.

Usually, the following appliances are put on or hooked on users' ears, and should be very small; a hearing aid which collects sounds from an external source, amplifies them, and output them to a user; a radio receiver which amplifies voice signals superimposed on transmitted radio waves and outputs them as voice sounds; a playback unit which reads stored voice signals from a memory and outputs them as voice sounds. The foregoing appliances are strongly demanded to be small by users.

There is a problem that it is very difficult to downsize such appliances when flat printed circuit boards are used. Further, functional components have to be connected using lead wires, which complicates an assembling process. Still further, incorrect wiring or disconnections may lead to problems which will result in reduced quality or reliability of appliances.

The present invention has been contemplated in order to provide a voice output unit which can overcome problems of the related art, and can simplify an assembling process, improves the quality and reliability, and is small as possible.

DISCLOSURE OF THE INVENTION

According to the invention, there is provided a voice output unit which includes: a power source supplying power to the voice output unit; a signal processing module which processes voice signals received from an external source as predetermined; an amplifier module which amplifies the voice signals processed by the signal processing module; an output module transmitting the amplified voice signals as voices; and a stereoscopic circuit board on which the power source, signal processing module, amplifier module and output module are assembled, and includes electrodes which are in electric contact with electrodes of the foregoing components.

The voice output unit further includes a sound collector which collects voice signals from the external source. The signal processing module processes the voice signals as predetermined.

The voice output unit includes a radio receiver which receives radio waves transmitted from the external source. The signal processing module processes voice signals which are superimposed on the received radio waves.

Further, the voice output unit includes a loading module to which a memory storing voice signals is attached. The signal processing module reads the voice signals from the memory, and processes the voice signals as predetermined.

BRIEF DESCRIPTION OF THE DRAWINGS

FIG. 4 is an exploded perspective view of a playback unit according to a third embodiment of the invention.

BEST MODE FOR CARRYING OUT THE INVENTION

Figure 1:
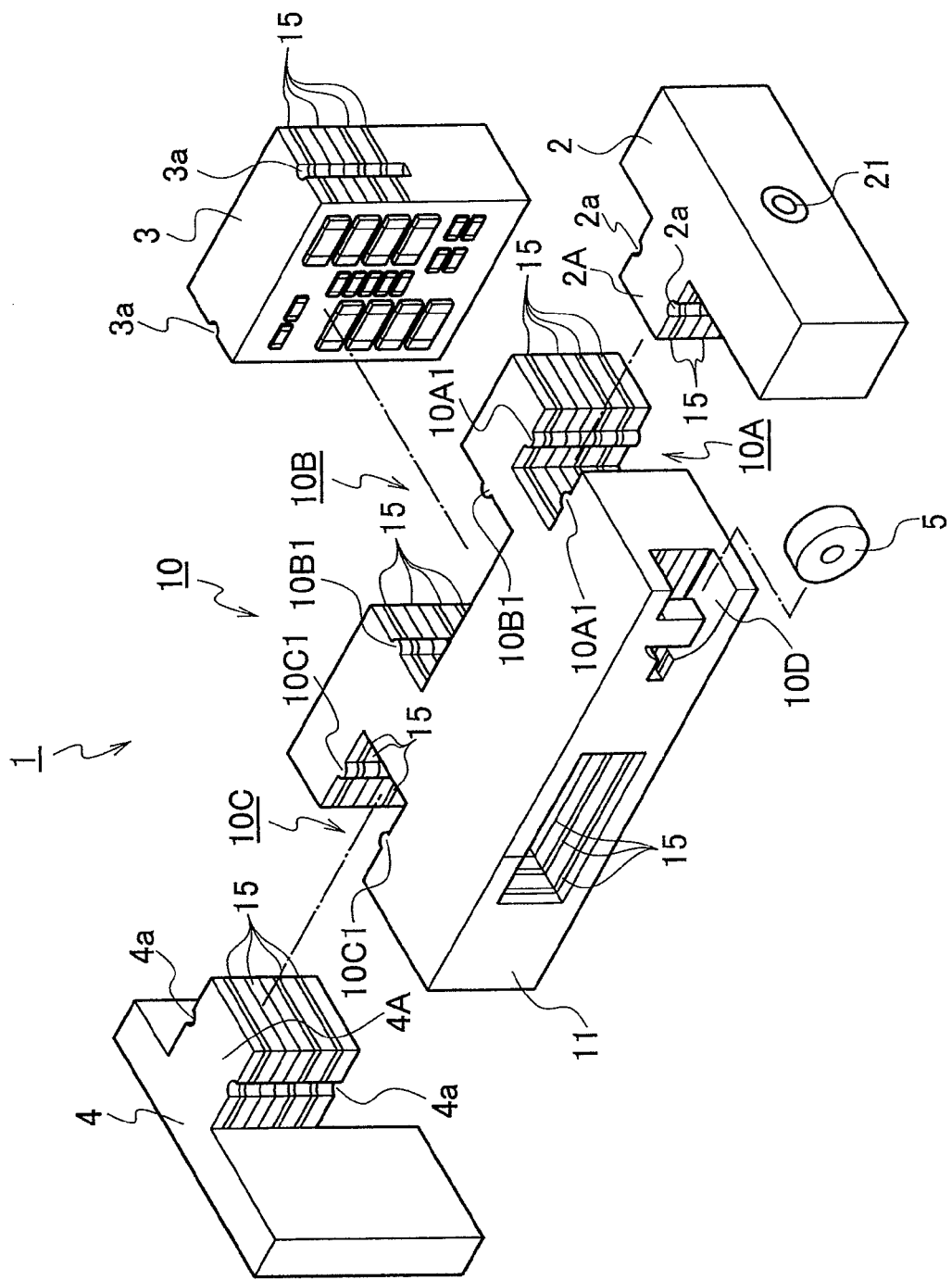
FIG. 1 is an exploded perspective view of a hearing aid according to a first embodiment of the invention.

The invention will be described with reference to embodiments shown in the drawings.

First Embodiment

Figure 2:
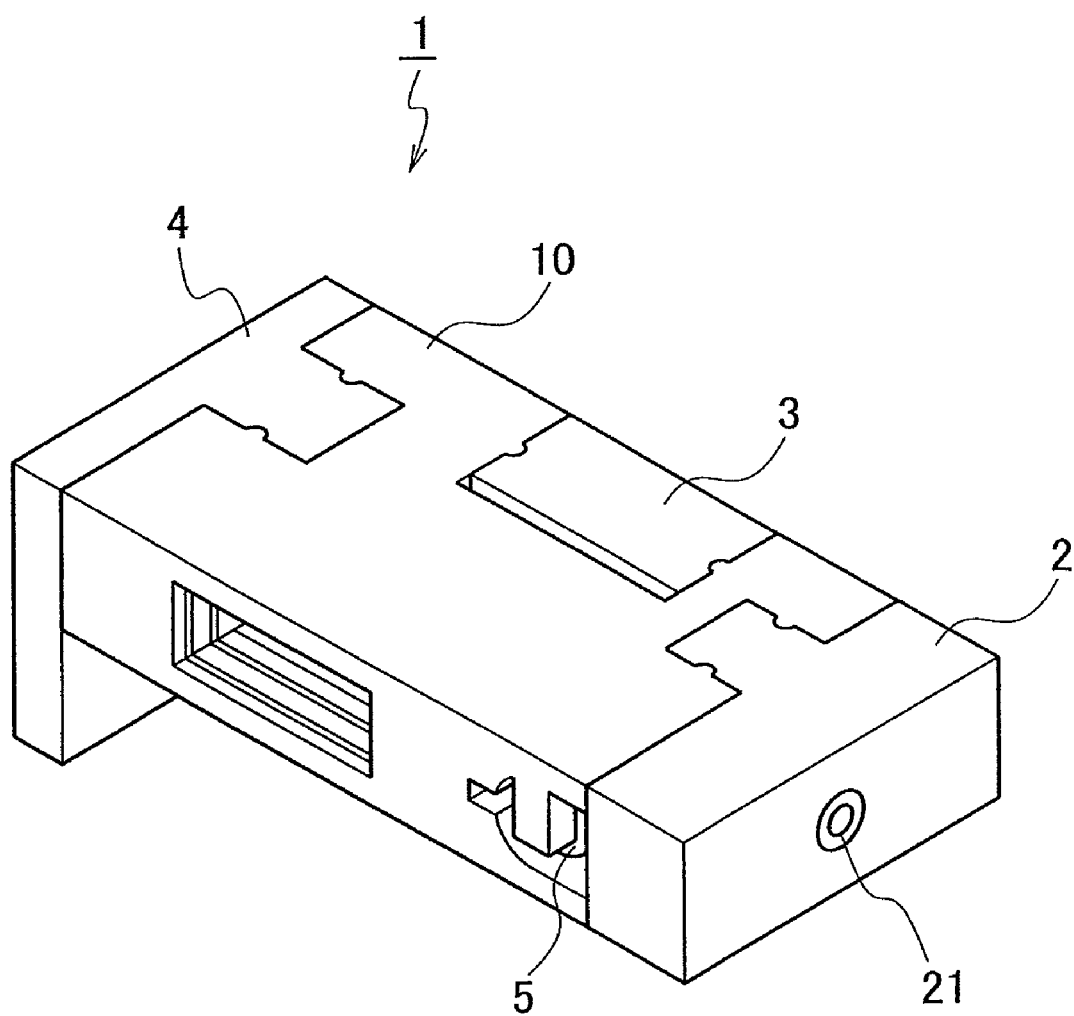
FIG. 2 is a perspective view of the hearing aid in an assembled state in the first embodiment.

In a first embodiment, the invention is applied to a hearing aid 1. Referring to FIG. 1, the hearing aid 1 includes a microphone module 2, a signal processing module 3, a speaker module 4, a power source 5, and a stereoscopic circuit board 10. Specifically, FIG. 1 shows a state in which the functional modules are not assembled to the stereoscopic circuit board 10. FIG. 2 shows the hearing aid 1 in which the functional modules are assembled to the stereoscopic circuit board 10.

As shown in FIG. 1, the microphone module 2 includes a microphone 21 collecting sounds from an external source, and has a projection 2A to be engaged with the stereoscopic circuit board 10. The projection 2A has two semicircular recesses 2a on its opposite side surfaces. Further, the projection 2A has electrodes 15 on its surfaces. The electrodes 15 are in electrical contact with the stereoscopic circuit board 10 when assembled.

The signal processing module 3 processes sounds collected by the microphone 21 so that they have frequency characteristics in response to the user's hearing acuity. Therefore, the signal processing module 3 is customized in order to satisfy the user's requirement. The signal processing module 3 has on its side surfaces a pair of semicircular recesses 3a which face with each other. Further, the signal processing module 3 has on its surfaces electrodes 15 to be connected to the stereoscopic circuit board 10.

The signal processing module 3 may be provided with a noise canceler in order to cancel noises.

The speaker module 4 includes a speaker (not shown), and outputs, as voices, the voice signals processed by the signal processing module 3. The speaker module 4 has a projection 4A to be assembled to the stereoscopic circuit board 10. The projection 4A has a pair of half semicircular recesses 4a on its opposite side surfaces. Further, the projection 4A has electrodes 15 on its surfaces. The electrodes 15 are in electric contact with the stereoscopic circuit board 10 when assembled.

The power source 5 supplies power to the modules constituting the hearing aid 1, and may be a replaceable primary cell or a rechargeable secondary cell.

The stereoscopic circuit board 10 is fabricated by the following processes: injection molding an insulating substrate 11 in a desired shape; forming thin films thereon; removing the thin films in accordance with a profile of patterns using laser beams; applying electrolytic copper plating to the patterns; applying soft etching to unnecessary parts of the thin films; and making circuits by electrically applying nickel and gold plating. Refer to Japanese Laid-open Patent Publication No. Hei 7-66533 for details of fabricating the stereoscopic circuit board.

After the foregoing fabrication processes, the stereoscopic circuit board 10 is formed with recesses 10A, 10B and 10C into which the projections 2A of the microphone module 2, the projection 3A of the signal processing module 3 and the projections 4A of the speaker module 4 are fitted.

The recess 10A has on its inner surface a pair of semicircular projections 10A1 to be engaged with the semicircular recesses 2a of the microphone module 2. This structure enables the stereoscopic circuit board 10 to be engaged with the microphone module 2. Specifically, the electrodes 15 on the inner surface of the recess 10A are in pressure contact with the electrodes 15 on the projection 2A of the microphone module 2.

The recess 10B has on its inner surface a pair of semicircular projections 10B1 to be engaged with the semicircular recesses 3a of the signal processing module 3. This structure enables the stereoscopic circuit board 10 to be engaged with the signal processing module 3. Specifically, the electrodes 15 on the inner surface of the recess 10B are in pressure contact with the electrodes 15 on the side surfaces of the signal processing module 3.

The recess 10C has on its inner surface a pair of semicircular projections 10C1 to be engaged with the semicircular recesses 4a of the speaker module 4. This structure enables the stereoscopic circuit board 10 to be engaged with the speaker module 4. Specifically, the electrodes 15 on the inner surface of the recess 10C are in pressure contact with the electrodes 15 on the projections 4A of the speaker module 4.

The stereoscopic circuit board 10 has a recess 10D into which the power source 5 (e.g. a battery) is fitted. Further, the stereoscopic circuit board 10 has a plurality of through-holes (not shown) in order to make the electrodes 15 extend therein. This enables the modules assembled in the stereoscopic circuit board 10 to be electrically and reliably connected.

Effects of First Embodiment

In the hearing aid 1, the various functional modules can be easily assembled on the stereoscopic circuit board 10, which is effective in improving the quality and reliability of the hearing aid 1. Further, the absence of lead wires reduces component assembling spaces and can downsize the hearing aid 1.

The signal processing module 3 has to be customized in order to accomplish frequency characteristics in accordance with user's hearing acuity. Since the signal processing module 3 can be easily assembled on the stereoscopic circuit board 10 without using any lead wires, the hearing aid 1 can be shipped to the user after checking the user's hearing ability. This means that a shipping deadline can be extensively accelerated.

Second Embodiment

Figure 3:
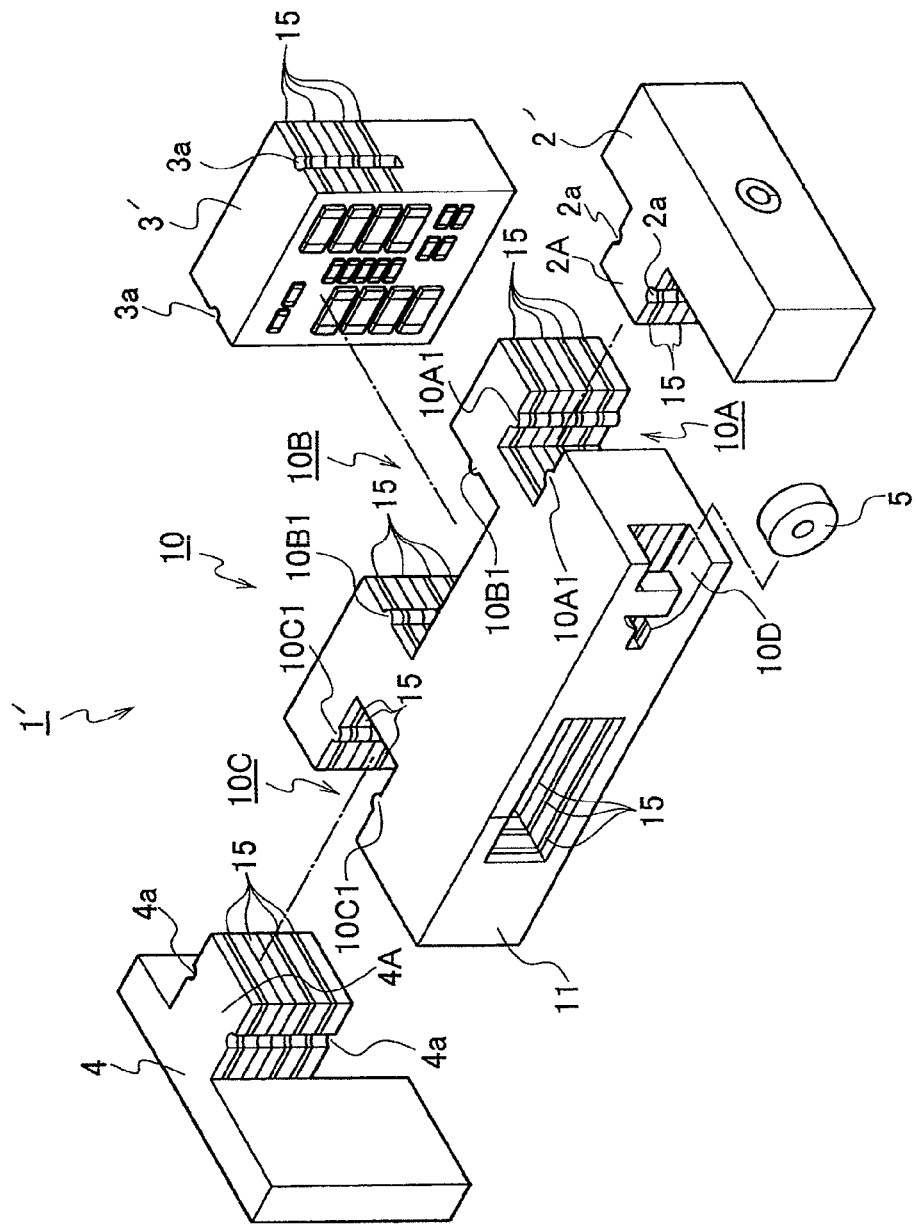
FIG. 3 is an exploded perspective view of a radio receiver according to a second embodiment of the invention.

In a second embodiment, the invention is applied to a radio receiver 1'. The radio receiver 1' (see FIG. 3) includes an antenna module 2' which is made by modifying the microphone module 2 of the hearing aid 1 (shown in FIG. 1 and FIG. 2) in order to receive radio waves transmitted by an external source, and a tuner module 3' by modifying the signal processing module 3 in order to receive radio waves having optional frequencies and demodulate the received radio waves.

Needless to say, it is possible to reduce the number of components by making an antenna circuit directly on the stereoscopic circuit board 10, and to improve the assembling process.

Effects of Second Embodiment

In the radio receiver of the second embodiment, the various functional modules can be easily assembled on the stereoscopic circuit board 10, which is effective in improving the quality and reliability of the radio receiver. Further, the absence of lead wires reduces component assembling spaces and can downsize the radio receiver.

Third Embodiment

In a third embodiment, the invention is applied to a playback unit 1". The playback unit 1" (see FIG. 4) includes a loading module 2" and a playback module 3". The loading module 2" is made by modifying the microphone module 2 of the hearing aid 1 (shown in FIG. 1 and FIG. 2) while the playback module 3" is made by modifying the signal processing module 3. The loading module 2" has a slot for receiving a memory storing voice signals. The playback module 3" reads out the voice signals from the memory, and demodulates the voice signals.

Effects of Second Embodiment

In the playback unit of the third embodiment, the various functional modules can be easily assembled on the stereoscopic circuit board 10, which is effective in improving the quality and reliability of the playback unit. Further, the absence of lead wires reduces component assembling spaces and can downsize the playback unit.

While we have shown and described some embodiments in accordance with our invention, it should be understood that disclosed embodiments are susceptible to changes and modifications without departing from the scope of the invention. Therefore, we do not intend to be bound by the details shown and described herein but intend to cover all such changes and modifications that fall within the ambit of the appended claims.

INDUSTRIAL APPLICABILITY

The invention is intended to overcome problems related to complicated assembling processes, improves the quality and reliability of appliances to which the invention is applied, and can accomplish downsizing.

The invention claimed is:
1. A voice output unit, comprising:
a power source that supplies power to the voice output unit;
a signal processing module that processes voice signals received from an external source;
an amplifier module that amplifies the voice signals processed by the signal processing module;
an output module that transmits the amplified voice signals as voices; and
a stereoscopic circuit board on which the power source, the signal processing module, the amplifier module and the output module are assembled, and that includes electrodes which are in electrical contact with electrodes of the power source, the signal processing module, the amplifier module and the output module when assembled, wherein at least one of the power source, the signal processing module, the amplifier module and the output module includes a projection, wherein the stereoscopic circuit board has at least one recess configured to receive one of the power source, the signal processing module, the amplifier module and the output module, and wherein the projection is fitted with the at least one recess such that at least two surfaces of the at least one recess contact the projection.

2. The voice output unit defined in claim 1 further comprising a sound collector which collects voice signals from the external source, wherein the signal processing module processes the collected voice signals.

3. The voice output unit defined in claim 1 further comprising a radio receiver which receives radio waves transmitted from the external source, wherein the signal processing module processes voice signals which are superimposed on the received radio waves.

4. The voice output unit defined in claim 1, further comprising a loading module to which a memory, storing voice signals, is attached, wherein the signal processing module reads the voice signals from the memory, and processes the voice signals.

* * * * *